United States Patent [19]

Mori et al.

[11] Patent Number: 4,635,231

[45] Date of Patent: Jan. 6, 1987

[54] SEMICONDUCTOR MEMORY WITH CONSTANT READOUT CAPABILITY

[75] Inventors: Toshiki Mori, Ibaraki; Haruyasu Yamada, Hirakata; Kenichi Hasegawa, Osaka; Kunitoshi Aono, Hirakata, all of Japan

[73] Assignee: Matsushita Electric Industrial Co., Ltd., Osaka, Japan

[21] Appl. No.: 662,900

[22] Filed: Oct. 19, 1984

[30] Foreign Application Priority Data

Oct. 24, 1983 [JP] Japan .................................. 58-197573

[51] Int. Cl.$^4$ ............................................ G11C 11/40
[52] U.S. Cl. ...................................... 365/190; 365/155
[58] Field of Search ............... 365/155, 179, 190, 174, 365/189; 307/455, 467

[56] References Cited

U.S. PATENT DOCUMENTS 4,125,877 11/1978 Reinert ..................... 365/190
4,412,312 10/1983 Berger et al. ............. 365/190

Primary Examiner—Stuart N. Hecker
Assistant Examiner—Glenn A. Gossage
Attorney, Agent, or Firm—Spencer & Frank

[57] ABSTRACT

To extend the function of a bipolar type RAM, a register function is added to the RAM function. The register function is such that the contents stored in a memory cell is inputted to a differential switch, and the output to the differential switch is derived out to constantly read out the stored content of a desired bit with a simple circuit construction.

5 Claims, 3 Drawing Figures

4,635,231

SEMICONDUCTOR MEMORY WITH CONSTANT READOUT CAPABILITY

BACKGROUND OF THE INVENTION

This invention relates to a semiconductor memory device which can constantly read out stored data thereby extending its function.

For a large capacity data storage, a semiconductor memory is used wherein data of a desired address is inputted or outputted through bit lines. With the recent trend toward digital signal processing for multi-functional purposes, a semiconductor memory is required which performs the function of constantly reading out a part of stored data without resort to or irrespective of address signals.

FIG. 1 shows part of the memory cells of a prior art semiconductor memory device. Each cell has a pair of multi-emitter transistors 101 and 102 with their base and collector connections mutually crossed, load resistors 103 and 104, and Schottky barrier diodes 117 and 118. A memory cell C1 of one bit is thus constructed, and the remaining memory cells C2, C3 and C4 have the same construction as the cell C1. A plurality of memory cells of the above construction, corresponding in number to the entire storage capacity, are arranged to constitute the memory device. The cells are connected to a positive word line 105 or 107 and to a negative word line 106 or 108. One emitter of one multi-emitter transistor and one emitter of the other multi-emitter transistor included in the respective cells are connected in common to a constant current source 119 or 120 via the negative word line 106 or 108. Each of the positive word lines 105 and 107 is connected to an address decoder so as to be set at a high potential during selection and at a low potential during non-selection. Bit lines 109, 110 and 111, 112 are respectively connected to constant current sources 113, 114 and 115, 116, and read/write data for a selected word is inputted to or outputted from these bit lines. A set of transistors 109' and 110' (or 111' and 112') are connected via the bit lines 109 and 110 (or 111 and 112) to the multi-emitter transistors 101 and 102 of each cell to cooperate therewith differentially.

The read operation of the memory device will now be described in respect of the memory cell C1, for example.

The word line 105 is first set at the high potential by the output of the address decoder and the bases of the transistors 109' and 110' are set at a reference potential $V_{ref}$. Assuming now that the multi-emitter transistor 101 has been written with "H" (high logic) and the multi-emitter transistor 102 with "L" (low logic), the base potential of the multi-emitter transistor 101 is lower than $V_{ref}$ with the result that the current of the constant current source 113 is passed through the transistor 109'. The base potential of the transistor 102 is on the other hand higher than Vref, therefore the current of the constant current source 114 is passed through the multi-emitter transistor 102. In this manner, the information of the memory cell C1 can be read in terms of the collector currents of the transistors 109' and 110'.

The operation for writing "L" into the multi-emitter transistor 101 and "H" into the multi-emitter transistor 102 of the memory cell C1 is as follows.

When the base of the transistor 109' is applied with "L" which is lower than low level of the memory cell and the base of the transistor 110' with "H" which is higher than the high level of the memory cell under the application of the high potential to the word line 105, the current of the constant current source 113 is passed through the multi-emitter transistor 101 to decrease its collector voltage, thereby writing "L" into the multi-emitter transistor 101. At the same time, the current of the constant current source 114 is passed through the transistor 110' to urge the multi-emitter transistor 102 "OFF" so that the collector voltage of the transistor 102 is rendered high to write "H" into the multi-emitter transistor 102.

As described above, in the prior art memory device, stored data is read from the entire stored data onto the bit lines by the address signal. Therefore, to meet the aforementioned demand for constantly reading out part of the stored data irrespective of the address signals, a register file, independent of the memory, is used and data which has been written in the register file is constantly read out as the output thereof. In such a case, separate write control circuits are required for both the register and the memory, thus complicating the circuit construction of the whole device.

SUMMARY OF THE INVENTION

The present invention contemplates elimination of the above prior art drawbacks and has for its object to provide a semiconductor memory device, of a simple circuit construction, having the function of constantly reading out part of stored data.

According to this invention, data stored in a memory cell of a desired bit is inputted to a pair of differential transistors, and the output of the differential transistor pair is derived out to ensure constant reading of the desired bit.

DESCRIPTION OF THE PREFERRED EMBODIMENTS

Figure 1:
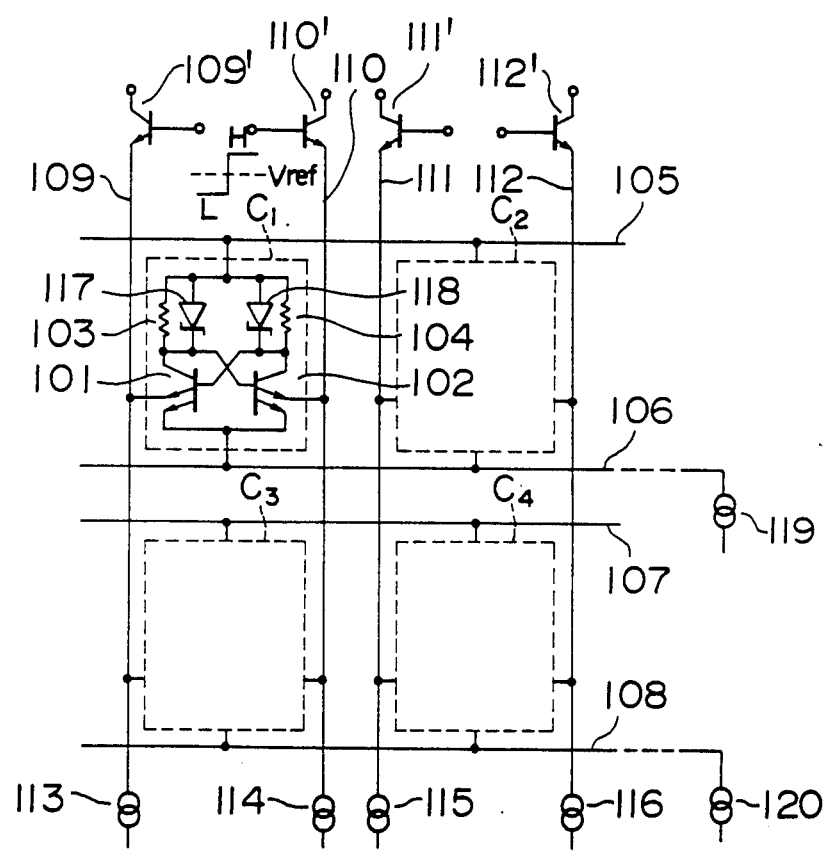
FIG. 1 is a circuit diagram showing part of memory cells of a prior art semiconductor memory device.
Figure 2:
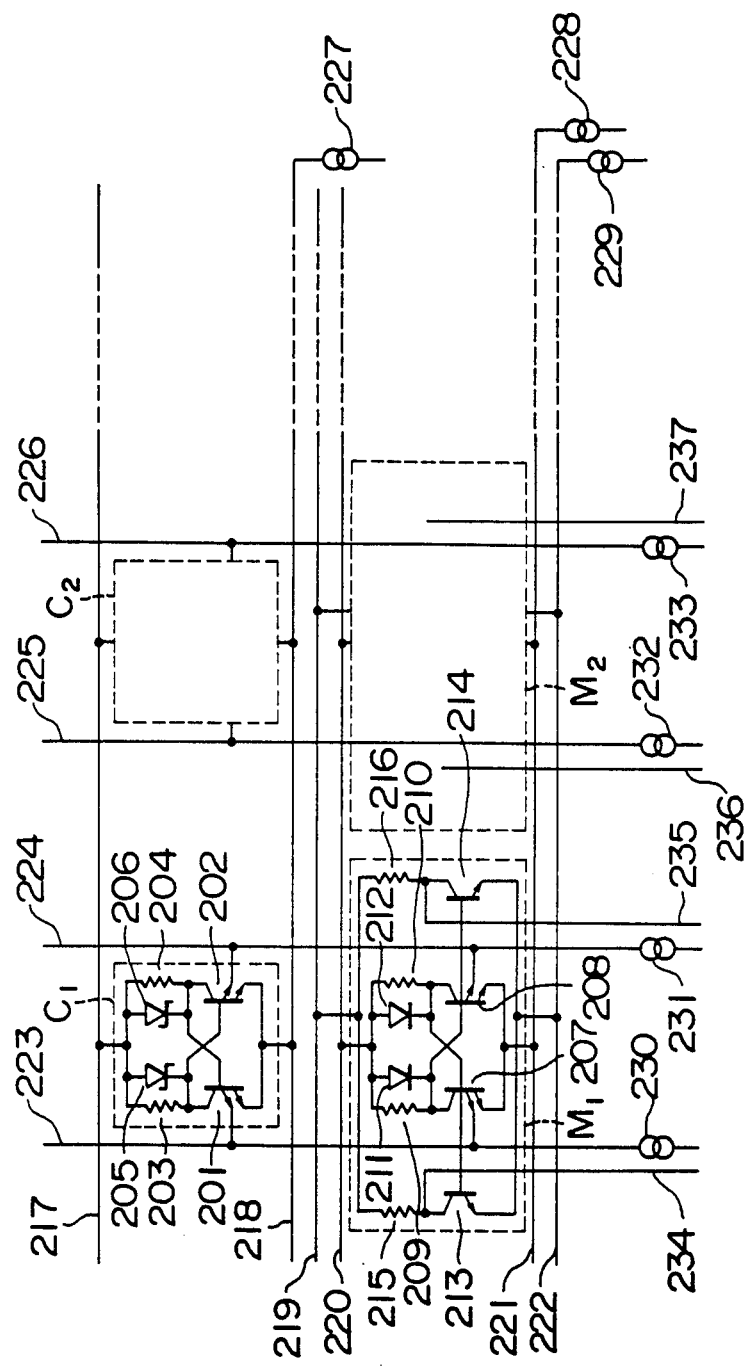
FIG. 2 is a circuit diagram showing a semiconductor memory device according to a first embodiment of the invention.

Referring now to FIG. 2, a first embodiment of a semiconductor memory device according to the invention shown in circuit diagram form comprises a memory cell C1 including multi-emitter transistors 201 and 202, resistors 203 and 204, and Schottky barrier diodes 205 and 206 to have the same construction as that of the memory cell described with reference to the FIG. 1 prior art example, and a memory cell C2 of the same construction as that of the cell C1. The majority of memory cells for constituting the memory device are of this type.

In addition to these memory cells, the memory device according to the invention comprises cell units of the type shown at M1 and M2 in FIG. 2 which add to the device the function of constantly reading out stored data of a desired bit. More particularly, a cell unit M1 comprises a memory cell including multi-emitter transistors 207 and 208, resistors 209 and 210 and Schottky barrier diodes 211 and 212, and a differential switch including a pair of transistors 213 and 214 with their emitters connected in common, and resistors 215 and 216. The cell unit is used for constantly reading out the stored data. A positive word line 217 is set by the address signal from the address decoder to the high potential during selection and to the low potential during non-selection. The emitters of the multi-emitter transistors included in the memory cell C1 are connected in common to a negative word line 218 connected to a constant current source 227. Reference numerals 219 designates a power supply line from a constant voltage source connected to the differential switch of the cell unit, 220 and 221 designate a positive word line and a negative word line respectively which are connected to the memory cell of the cell unit, and 222 designates a common emitter line connected to the differential switch. The negative word line 221 is connected to a constant current source 228, and the common emitter line 222 is connected to a constant current source 229. Bit lines 223 to 226 are connected to constant current sources 230 to 233, respectively. Output terminals 234 to 237 are provided for constantly read data.

The memory cells C1 and C2 are connected to the positive word line 217, negative word line 218 and bit lines 223 to 226 in the same manner as the cells of the FIG. 1 prior art example. Accordingly, when reading, data stored in the memory cells of a word selected by an address signal is outputted to the bit lines and when writing, data inputted to the bit lines is written into the memory cells of a word selected by an address signal. The memory cell, including the multi-emitter transistors 207 and 208, resistors 209 and 210, and Schottky barrier diodes 211 and 212 and connected to the positive word line 220, negative word line 221 and bit lines 223 and 224, has the same construction as the memory cell C1 and operates to write in the same manner as the memory cell of the prior art example shown in FIG. 1. Specifically, data inputted to the bit lines are written into the memory cells of a word associated with a positive word line which is selected by an address signal and set at the high potential. When reading, data stored in the memory cells of a word associated with a positive word line selected by an address signal and set at the high potential are outputted onto the bit lines 223 to 226. In other words, only the stored data for the word selected by the address signal are outputted to the bit lines.

To constantly read the stored data, data stored in the memory cell is read out without being passed through the bit lines. In the cell unit M1, a potential difference corresponding to the content of the stored data develops, irrespective of the address signal, between the collectors of the multi-emitter transistors 207 and 208. An input signal representative of the potential difference is applied across the bases of the paired differential transistors 213 and 214 included in the differential switch, and an output signal is delivered between the constantly read data output terminals 234 and 235 standing for the output terminals of the differential switch, thereby ensuring that the stored data can be read out constantly irrespective of the address signal.

The cell unit M2 has the same construction as the cell unit M1. Since the data is usually read in words, where a word is an ordered set of characters that is the normal unit in which information may be stored, a number of the cell units for constant read-out are arranged in word units with the common emitters of their differential transistor pairs 213 and 214 also arranged in word units and connected in common to the constant current drive source 229 via the common emitter line 222.

As described above, the data stored in the memory cell is inputted into the differential switch without being passed through the bit lines, and the data is derived out of the output of the differential switch, so that stored data of a desired bit can be read out constantly irrespective of the address signal.

Figure 3:
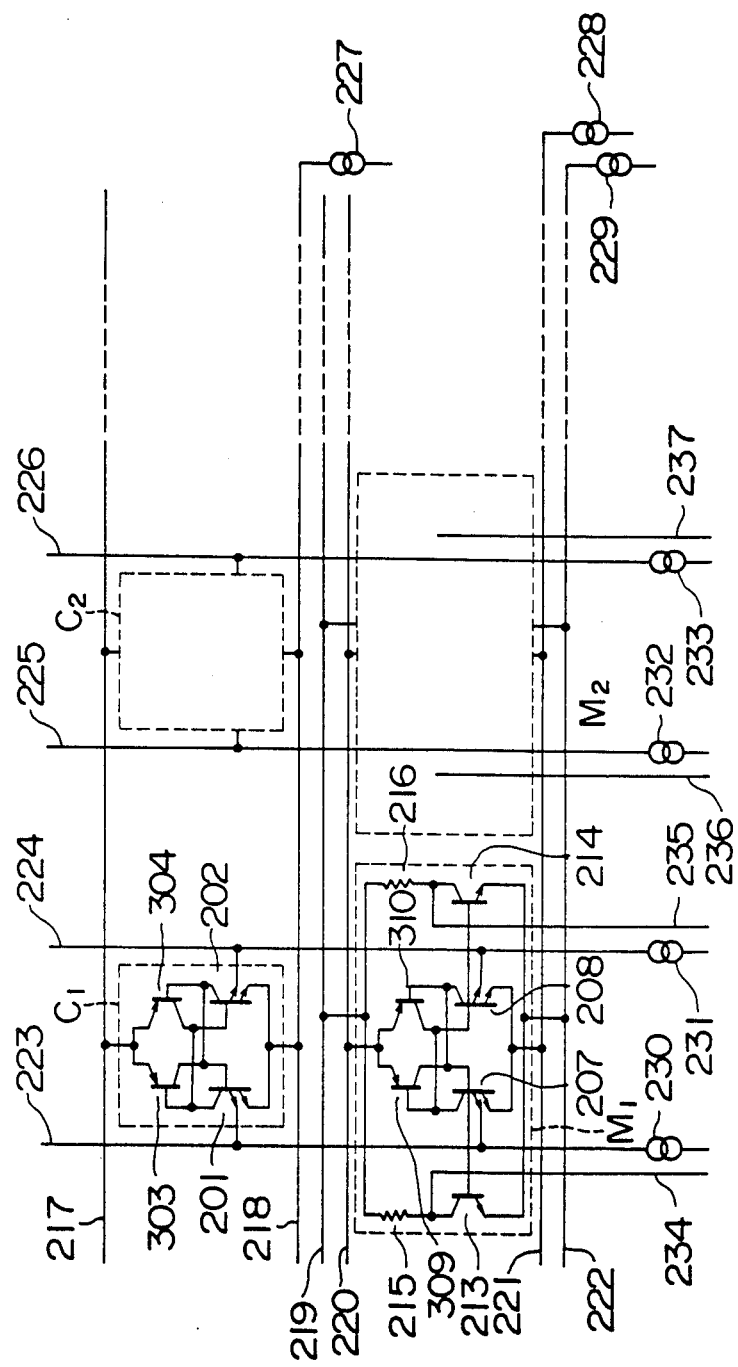
FIG. 3 is a circuit diagram showing a semiconductor memory device according to a second embodiment of the invention.

FIG. 3 is a circuit diagram showing the construction of a semiconductor memory device according to another embodiment of the invention. In FIG. 3, elements identical to those of FIG. 2 are designated by identical reference numerals. The memory cell in FIG. 3 has a different construction from that of the memory cell in FIG. 2. More particularly, a memory cell C1 includes PNP transistors 303 and 304 loaded on multi-emitter transistors 201 and 202, and a memory cell of a cell unit M1 includes PNP transistors 309 and 310 loaded on multi-emitter transistors 207 and 208. Obviously, the memory cell C1 and cell unit M1 of FIG. 3 and those of FIG. 2 operate in a similar manner.

As has been described, according to the invention, the constant reading of stored data can be effected with a simple circuit construction, and the register file and the memory, which are independent of each other in the prior art device, can be united. Consequently, the write control circuit for the register file can be dispensed with, thereby making it possible to realize a memory device with a simple circuit construction which is adaptable to complicated functions. When the constant reading of the data is to be effected in word units, the common emitters of the differential transistor pairs constituting the differential switches are arranged in word units and connected in common to the constant current drive source to thereby reduce the number of elements necessary for constructing the circuit.

What is claimed is:

1. A semiconductor memory device comprising:
   a plurality of memory cells each having a pair of cross-coupled multi-emitter transistors, each of said memory cells being coupled between a respective pair of bit lines;
   means, associated with at least part of said memory cells, for deriving out of said memory cells storage signals without being passed through the cells' associated bit lines; and
   a differential switch associated with said means and including a pair of differential transistors having emitters connected in common and receiving the storage signal derived out by said means, whereby the storage signal is constantly read out of the output of said differential switch.

2. A semiconductor memory device according to claim 1, wherein said differential switch is supplied with a supply voltage from a constant voltage source.

3. A semiconductor memory device according to claim 1, wherein a plurality of differential switches are arranged in word units, and common emitters of said differential switches are connected in common to a current source to effect reading of the storage signals in word units.

4. A semiconductor memory device comprising:
   first and second cross-coupled multi-emitter transistors each having two emitters, the first emitter of each of said multi-emitter transistors being commonly connected to a negative word line and the second emitter of each of said multi-emitter transistors being connected to respective bit lines;

first and second parallel connections of a resistor and a Schottky barrier diode respectively connected between each collector of said first and second multi-emitter transistors and a positive word line; and first and second transistors having bases respectively connected to the collectors of said first and second multi-emitter transistors, collectors connected in common to a constant voltage source through respective resistors, and emitters connected in common.

5. A semiconductor memory device comprising:

first and second cross-coupled multi-emitter transistors each having two emitters, the first emitter of each of said multi-emitter transistors being commonly connected to a negative word line and the second emitter of each of said multi-emitter transistors being connected to respective bit lines;

first and second transistors having bases respectively connected to the collectors of said first and second multi-emitter transistors, collectors connected to the bases of said first and second multi-emitter transistors, and emitters connected in common to a positive word line; and third and fourth transistors having bases respectively connected to the collectors of said first and second multi-emitter transistors, collectors connected in common to a constant voltage source through respective resistors, and emitters connected in common.

* * * * *